United States Patent

Lee et al.

[11] Patent Number: 6,163,076
[45] Date of Patent: Dec. 19, 2000

[54] STACKED STRUCTURE OF SEMICONDUCTOR PACKAGE

[75] Inventors: Chun-Chi Lee, Kaohsiung; Kuang-Lin Lo; Kuang-Chwn Chou, both of Kaohsiung Hsien; Shih-Chih Chen, Kaohsiung, all of Taiwan

[73] Assignee: Advanced Semiconductor Engineering, Inc., Kaohsiung, Taiwan

[21] Appl. No.: 09/325,382

[22] Filed: Jun. 4, 1999

[51] Int. Cl.[7] ............................. H01L 23/48; H01L 23/52; H01L 29/40
[52] U.S. Cl. ............................ 257/777; 257/730; 257/666
[58] Field of Search ................................ 257/777, 666, 257/730, 685, 686

[56] References Cited

U.S. PATENT DOCUMENTS

| | | | |
|---|---|---|---|
| 4,463,217 | 7/1984 | Orcutt | 174/52 |
| 4,691,225 | 9/1987 | Murakami et al. | 257/730 |
| 5,293,067 | 3/1994 | Thompson et al. | 257/668 |
| 5,388,029 | 2/1995 | Moriyama | 361/760 |
| 5,729,437 | 3/1998 | Hashimoto | 361/760 |
| 5,861,668 | 1/1999 | Cha | 257/692 |

FOREIGN PATENT DOCUMENTS

| | | | |
|---|---|---|---|
| 60-38843 | 2/1985 | Japan | 257/730 |
| 60-177656 | 9/1985 | Japan | 257/730 |
| 61-53746 | 3/1986 | Japan | 257/730 |
| 2-239651 | 9/1990 | Japan | 257/730 |

*Primary Examiner*—Mahshid Saadat
*Assistant Examiner*—Jhihan B. Clark
*Attorney, Agent, or Firm*—Bacon & Thomas, PLLC

[57] ABSTRACT

A stacked structure of a semiconductor package mainly comprises a first chip, a second chip, a substrate and a lead frame. The first chip and the second chip are attached on the surface of the substrate by a plurality of solder bumps by means of flipchip bonding. Then, the first chip, the second chip and the substrate form a stacked structure. A plurality of plugs of the substrate is provided along an edge of the substrate so as to attach to a plurality of receptacles of the lead frame to form a semiconductor device. The plugs are attached to the receptacles of the lead frame by silver paste to form a semiconductor device in such a way that the first chip and the second chip electrically connect to the lead frame. In addition, the lead frame is bent to form a plurality of fingers, which is placed in a space that is formed by a sidewall of the chip and a surface of the substrate while it is assembled. An encapsulant covers the stacked structure, then the fingers are exposed on the surface of the encapsulant, so that the first chip and the second chip can be operated by means of the fingers.

5 Claims, 2 Drawing Sheets

STACKED STRUCTURE OF SEMICONDUCTOR PACKAGE

BACKGROUND OF THE INVENTION

1. Field of the Invention

The present invention relates generally to a stacked structure of a semiconductor package and more particularly to two chips attached to a substrate by means of flipchip bonding.

2. Description of the Related Art

A stacked structure is a high density and performance packaging technique. If chips can be packaged more densely on the surface of the substrate, the dimension of the stacked structure can be reduced. Recently other stacking concepts have been developed. One possible way of minimizing the dimension of packaging involves placing leads in the appropriate spaces.

U.S. Pat. No. 5,861,668, issued on Jan. 19, 1999 to Cha, discloses a semiconductor package including a paddle layer having a metal wiring pattern formed therein, semiconductor chips bonded on at least one surface of the paddle layer. A plurality of wires electrically connecting a plurality of chip pads formed on the semiconductor chips with the paddle layer. Each lead includes a first lead bonded to a surface of the paddle layer and a second lead, which is at least partially exposed. A conductive adhesive bonds the paddle layer to the first lead and a molding resin comprises the body of the package. The semiconductor package of the above construction has various advantages compared to conventional packages. The occupying area rate can be minimized and an undesired curving of the lead can be prevented. Further, since the semiconductor chip can be bonded on both surfaces of the paddled layer, an integrated semiconductor package can be achieved. As shown in FIG. 1, the semiconductor package of U.S Pat. No. 5,861,668 includes a first chip 101, a second chip 102, a paddle layer 103 and a lead frame 104. The first chip 101 and the second chip 102 are attached on the surface of the paddle layer 103 by a plurality of solder bumps 106 by means of flipchip bonding. Then, the first chip 101, the second chip 102 and the paddle layer 103 form a stacked structure. A plurality of fingers (not labeled) of the substrate 103 is provided along an edge of the paddle layer 103. The fingers are stacked and connected to the lead frame 104 by silver paste to form a semiconductor device in such a way that the first chip 101 and the second chip 102 electrically connect to the lead frame 104. In addition, the lead frame 104 is bent to form a plurality of fingers 105, which is placed under the stacked structure while it is assembled. An encapsulant 107 covers the stacked structure, then the fingers 105 are exposed on the surface of the encapsulant 107, so that the first chip 101 and the second chip 102 can be operated by means of the fingers 105. However, the stacked structure is stacked on the lead frame 104, and the leads of the semiconductor package form a space that can contain the wires, so that the thickness or the dimensions of the semiconductor package cannot be reduced.

The present invention intends to provide a stacked structure having a space where can contain leads in such a way as to mitigate and overcome the above problem.

SUMMARY OF THE INVENTION

The primary object of this invention is to provide a stacked structure of a semiconductor package, which forms a space to contain leads so as to reduce the thickness or the dimensions of the semiconductor package.

The present invention is a stacked structure of a semiconductor package in accordance with an embodiment; the semiconductor package mainly comprises a first chip, a second chip, a substrate and a lead frame. The first chip and the second chip are attached on the surface of the substrate by a plurality of solder bumps by means of flipchip bonding. Then, the first chip, the second chip and the substrate form a stacked structure. A plurality of plugs of the substrate is provided along an edge of the substrate so as to attach to a plurality of receptacles of the lead frame to form a semiconductor device. The plugs are attached to the receptacles of the lead frame by silver paste to form a semiconductor device in such a way that the first chip and the second chip electrically connect to the lead frame. In addition, the lead frame is bent to form a plurality of fingers, which is placed in a space that is formed by a sidewall of the chip and a surface of the substrate while it is assembled. An encapsulant covers the stacked structure, then the fingers are exposed on the surface of the encapsulant, so that the first chip and the second chip can be operated by means of the fingers.

Other objects, advantages and novel features of the invention will become more apparent from the following detailed description and the accompanying drawings.

BRIEF DESCRIPTION OF THE DRAWINGS

The present invention will now be described in detail with reference to the accompanying drawings wherein.

DETAILED DESCRIPTION OF THE INVENTION

Figure 1:
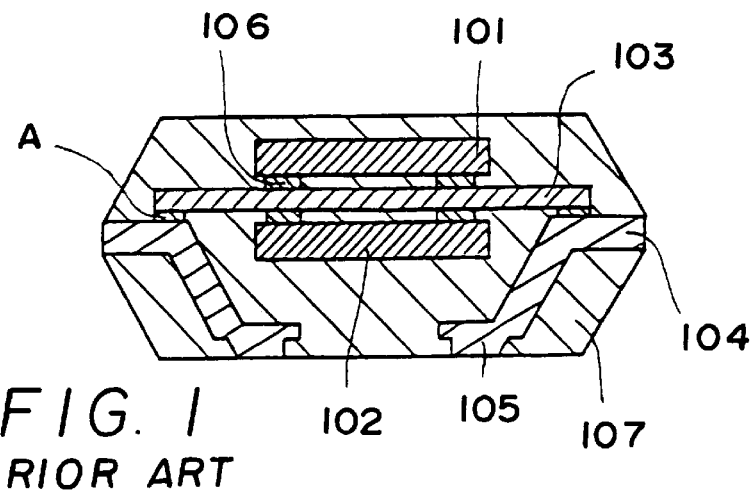
FIG. 1 is a sectional view of a semiconductor package in accordance with U.S. Pat. No. 5,861,668.

A stacked semiconductor package in accordance with the present invention mainly includes a first chip, a second chip and a substrate. The substrate is sandwiched between the first chip and the second chip so as to form a stacked structure, and the stacked structure has an edge, which is formed by the ends of the substrate. The stacked structure is placed in a lead frame so as to reduce the total thickness or the dimension of the stacked semiconductor package. The lead frame has a plurality of bent sticks, which have two ends, one end connects to the lead frame and forms a receptacle and the other end forms a finger. The receptacles and the fingers surround the stacked structure. A plurality of plugs are provided on the edge of the substrate so as to attach to the receptacles of the lead frame while the stacked structure is placed in the lead frame. Then, the fingers are arranged in a space which is together defined by the surface of the substrate and the sidewall of the chip so as to reduce the dimensions of the fingers in the stacked semiconductor package.

Referring to FIGS. 2, 3, 4 and 5, a semiconductor package in accordance with the present invention mainly comprises a first chip 201, a second chip 202, a substrate 203 and a lead frame 206. The first chip 201 and the second chip 202 are attached on the surface of the substrate 203 by a plurality of solder bumps B by means of flipchip bonding. An underfill C, epoxy or the like, is filled between the chips 201 and 202 and the substrate 203. Then, the first chip 201, the second chip 202 and the substrate 203 form a stacked structure. The stacked structure is placed in a lead frame 206 so as to reduce the total thickness or the dimensions of the stacked semiconductor package. The stacked structure has an edge, which is formed by the edge of the substrate 203. The lead frame 206 has a plurality of bent sticks 208, which have two ends, one end connects to the lead frame 206 and forms a receptacle 209 and the other end forms a finger 207. The receptacles 209 and the fingers 207 surround the stacked structure. A plurality of plugs 204 of the substrate 203 is provided along an edge of the substrate 203 so as to attach to a plurality of receptacles 209 of the lead frame 206 to form a semiconductor device. The plugs 204 are attached to the receptacles 209 of the lead frame 206 by silver paste to form a semiconductor device in such a way the first chip 201 and the second chip 202 electrically connect to the lead frame 206. In addition, a bottom of the plug 204 is recessed to form a stem 205 to be held in a place by a protrusion 210 of the receptacle 209 in order to avoid an open circuit of the semiconductor package. The lead frame 206 is bent to form a plurality of fingers 207, which is placed in a space that is formed by a sidewall of the chips 201 and 202 and a surface of the substrate 203 while it is assembled. An encapsulant 211 covers the stacked structure, then the fingers 207 are exposed on the surface of the encapsulant 211, so that the first chip 201 and the second chip 202 can be operated by means of the fingers 207.

Figure 2:
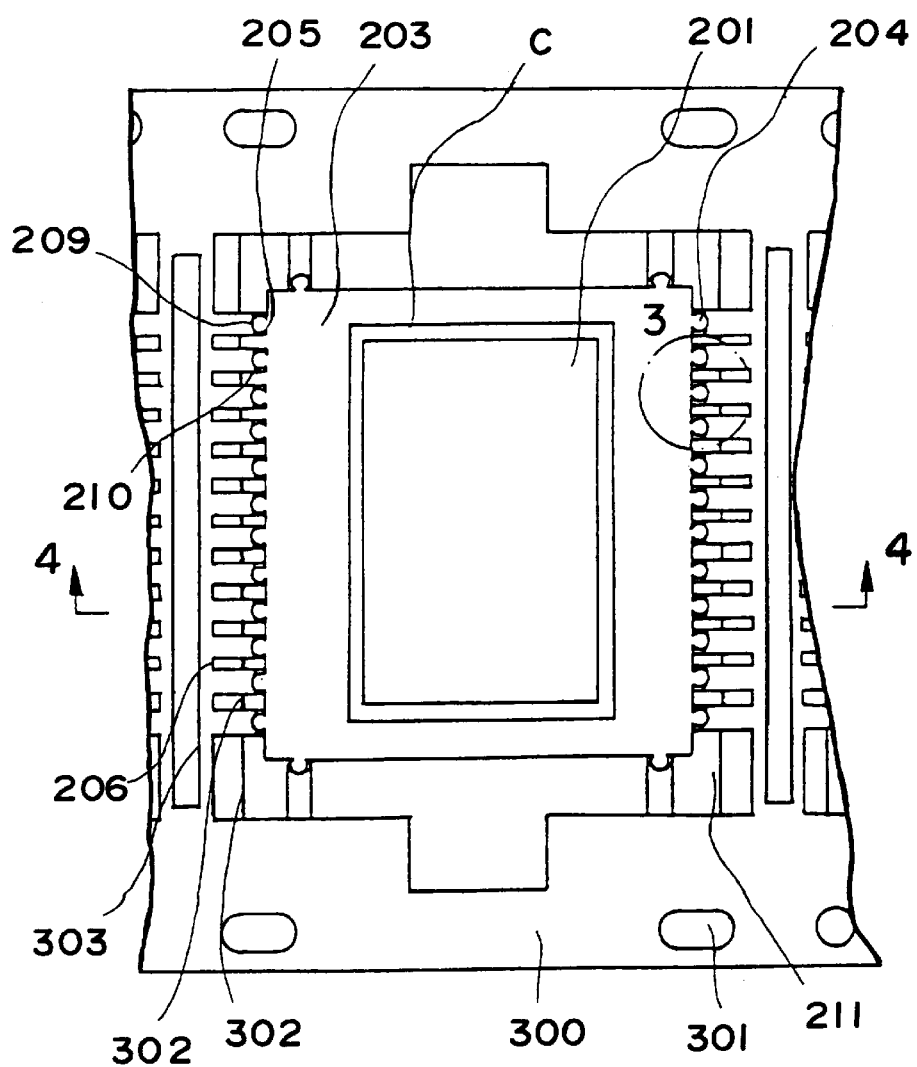
FIG. 2 is a top view of a semiconductor package in accordance with the present invention.
Figure 3:
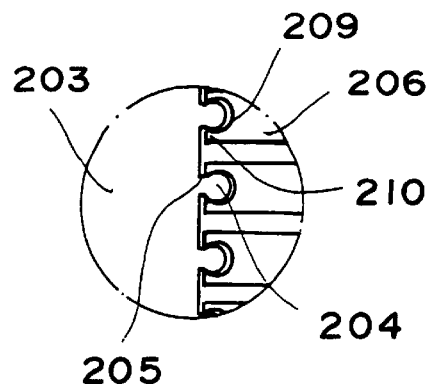
FIG. 3 is a sectional view of FIG. 2, along line 3–3, of the semiconductor package in accordance with the present invention.

Referring to FIG. 2, the lead frame 206 of the present invention is held by two carrier rails 300, which provides a plurality of guide holes 301 so as to carry and position the lead frame 206 in a machine, so that the machine process the stacked semiconductor package. A plurality of support structures 302 connects the fingers 207 to one another, and further connects the finger 207 and carrier rail 300. The bottoms of the fingers 207 are fixed on a separating member 303 which connects between the two carrier rails 300. After the stacked structure and the lead frame 206 are assembled, the bottoms of the fingers 207 and support structures 302 are cut so as to separate the lead frame 206 and the carrier rail 300.

Figure 4:
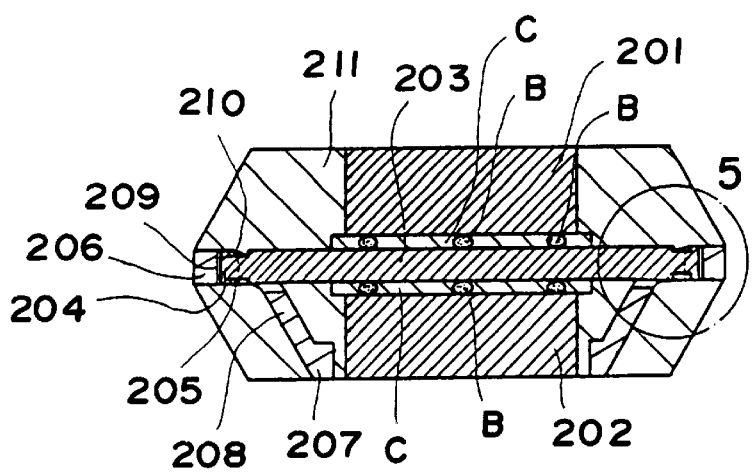
FIG. 4 is a sectional view of the semiconductor package in accordance with the present invention.
Figure 5:
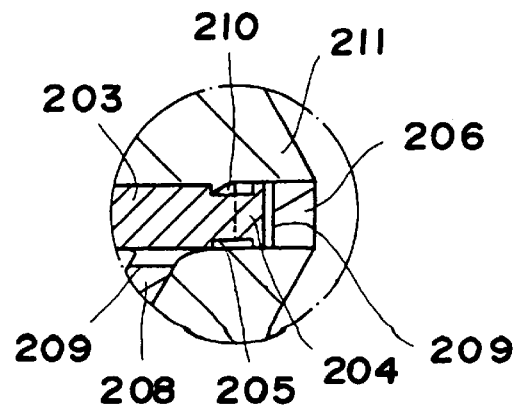
FIG. 5 is an enlarged view of FIG. 4 of the semiconductor package in accordance with a first embodiment of the present invention.

Referring to FIGS. 1 and 4, U.S. Pat. No. 5,861,668 is compared with the present invention. The stacked structure of U.S. Pat. No. 5,861,688 is stacked on the lead frame 104, and the fingers 105 are placed below the second chip 102 in such a way as to increase the dimensions of the semiconductor package. However, the stacked structure of the present invention is placed in a lead frame 206 so as to reduce the total thickness or the dimensions of the stacked semiconductor package. In addition, the fingers 207 are placed in a space that is formed by a sidewall of the chip 201, 202 and a surface of the substrate 203 while it is assembled. So, the present invention reduce the total thickness or the dimensions of the stacked semiconductor package.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A stacked structure of a semiconductor package comprising:
    a substrate having an upper surface and a lower surface, with a plurality of plugs provided on the edge of the substrate;
    a first chip mounted on the upper surface of the substrate by flipchip bonding;
    a second chip mounted on the upper surface of the substrate by flipchip bonding to form a stacked structure;
    a lead frame having a plurality of fingers which connects the plugs of the substrate; and
    an encapsulant covering the stacked structure and the lead frame, and the fingers of the lead frame exposed on a surface of the encapsulant;
    wherein the fingers connect the first chip and the second chip through the substrate.

2. The stacked structure of a semiconductor package as defined in claim 1, wherein the lead frame has a plurality of fingers which has a receptacle to receive the plug of the substrate while the stacked semiconductor is placed in the lead frame.

3. The finger structure of a semiconductor package as defined in claim 2, wherein the plug has a stem at a bottom to receive a protrusion of the receptacle.

4. A stacked structure of a semiconductor package comprising:
    a substrate having an upper surface and a lower surface, with a plurality of plugs provided on the edge of the substrate;
    a first chip mounted on the upper surface of the substrate by flipchip bonding;
    a second chip mounted on the upper surface of the substrate by flipchip bonding to form a stacked structure;
    a lead frame having a plurality of fingers which is placed in a space that is defined by a surface of the substrate and a sidewall of the chip while the stacked structure is placed in the lead frame; and
    an encapsulant covering the stacked structure and the lead frame, and the finger of the lead frame are exposed on a surface of the encapsulant;
    wherein the fingers connect the first chip and the second chip through the substrate.

5. The stacked structure of a semiconductor package as defined in claim 4, wherein the lead frame is bent to form the fingers.

* * * * *